(12) United States Patent
Wu et al.

(10) Patent No.: US 8,823,000 B2
(45) Date of Patent: Sep. 2, 2014

(54) PIXEL STRUCTURE AND MANUFACTURING METHOD THEREOF

(75) Inventors: Kuo-Wei Wu, New Taipei (TW);
Chin-Tzu Kao, Changhua County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 88 days.

(21) Appl. No.: 13/437,003

(22) Filed: Apr. 2, 2012

(65) Prior Publication Data
US 2013/0175531 A1    Jul. 11, 2013

(30) Foreign Application Priority Data
Jan. 11, 2012    (TW) .............................. 101101065 A

(51) Int. Cl.
*H01L 29/786*    (2006.01)

(52) U.S. Cl.
USPC .............. 257/59; 257/E21.411; 257/E29.273; 257/72; 438/158

(58) Field of Classification Search
None
See application file for complete search history.

(56) References Cited

U.S. PATENT DOCUMENTS

| | | |
|---|---|---|
| 7,102,712 B2 | 9/2006 | Anno |
| 2006/0180837 A1* | 8/2006 | Na et al. .................... 257/291 |
| 2008/0158457 A1 | 7/2008 | Park |
| 2010/0273284 A1 | 10/2010 | Lee |

FOREIGN PATENT DOCUMENTS

| | | |
|---|---|---|
| CN | 1677202 A | 10/2005 |
| TW | 200901460 | 1/2009 |
| TW | 201102724 | 1/2011 |

* cited by examiner

*Primary Examiner* — Fernando L Toledo
*Assistant Examiner* — Valerie N Newton
(74) *Attorney, Agent, or Firm* — Winston Hsu; Scott Margo

(57) ABSTRACT

A pixel structure includes a substrate, a gate line, a data line, a semiconductor pattern, a non-metal source electrode pattern, a non-metal drain electrode pattern, and a pixel electrode. The gate line and the data line are disposed on the substrate. The semiconductor pattern is disposed on the gate line, and the semiconductor pattern overlaps two corresponding edges of the gate line along a vertical projective direction. The non-metal source electrode pattern and the non-metal drain electrode pattern are disposed on the semiconductor pattern. The non-metal source electrode pattern and the non-metal drain electrode pattern are respectively disposed on two corresponding edges of the gate line. The non-metal source electrode pattern is partially disposed between the data line and the gate line. The pixel electrode is electrically connected to the non-metal drain electrode pattern.

8 Claims, 10 Drawing Sheets

PIXEL STRUCTURE AND MANUFACTURING METHOD THEREOF

BACKGROUND OF THE INVENTION

1. Field of the Invention

The present invention relates to a pixel structure and a manufacturing method thereof, and more particularly, to a pixel structure with high aperture ratio and a manufacturing method thereof.

2. Description of the Prior Art

As liquid crystal display (LCD) technology keeps improving, LCD panels have been widely used in various types of consumer electronics products, such as flat-screen TVs, notebooks, and mobile phones.

The pixel structure of a thin film transistor liquid crystal display (TFT LCD) panel contains pixel electrodes, thin-film transistors (TFTs), and interconnect wirings of gate lines and data lines. The TFT contains the gate electrode, the semiconductor layer, the source electrode, and the drain electrode. The source electrode and the drain electrode are usually formed by the same non-transparent metallic material used in data lines. Therefore, considering the design parameters, such as the channel width over length (W/L) ratio and the limitations of critical dimensions in the TFT fabrication process, the size and location of TFTs would have a direct impact on the region that is transparent to light. In other words, the aperture ratio of a pixel structure cannot be increased because of the effect and restrictions of the source electrode and the drain electrode made of non-transparent metallic material. In order to increase the aperture ratio, to enhance LCD's display quality, and to reduce backlight power consumption, we must improve the pixel structure design.

SUMMARY OF THE INVENTION

In one aspect of the present invention, a pixel structure and a manufacturing method thereof are provided. The ohmic contact layer is used to form the non-metal source electrode pattern and the non-metal drain electrode pattern respectively on two corresponding edges of the gate line to reduce the proportion of non-transparent electrode pattern area, thereby increasing the aperture ratio of the pixel structure.

Accordingly, in an embodiment of the present invention, a pixel structure is provided. The pixel structure includes a substrate, a gate line, a data line, a semiconductor pattern, a non-metal source electrode pattern, a non-metal drain electrode pattern, and a pixel electrode. The gate line and the data line are disposed on the substrate. The semiconductor pattern is disposed on the gate line, and the semiconductor pattern overlaps two corresponding edges of the gate line along a vertical projective direction. The non-metal source electrode pattern and the non-metal drain electrode pattern are disposed on the semiconductor pattern. The non-metal source electrode pattern and the non-metal drain electrode pattern are respectively disposed on the two corresponding edges of the gate line. The non-metal source electrode pattern is partially disposed between the data line and the gate line to be electrically connected to the data line. The pixel electrode is disposed on the substrate. The pixel electrode is electrically connected to the non-metal drain electrode pattern.

Accordingly, in an embodiment of the present invention, a manufacturing method of a pixel structure is provided. The method includes the following steps. First, a substrate is provided, and a gate line is then formed on the substrate. A gate dielectric layer is formed on the gate line. A semiconductor layer and an ohmic contact layer are formed sequentially on the gate dielectric layer. A patterning process is performed on the semiconductor layer to form a semiconductor pattern. The semiconductor pattern overlaps two corresponding edges of the gate line along a vertical projective direction. A data line is formed on the ohmic contact layer and the gate dielectric layer. The data line partially overlaps the gate line along the vertical projective direction. Then, an etching process is performed on the ohmic contact layer to respectively form a non-metal source electrode pattern and a non-metal drain electrode pattern on the two corresponding edges of the gate line. Thereafter, a pixel electrode is formed on the substrate, and the pixel electrode is electrically connected to the non-metal drain electrode pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
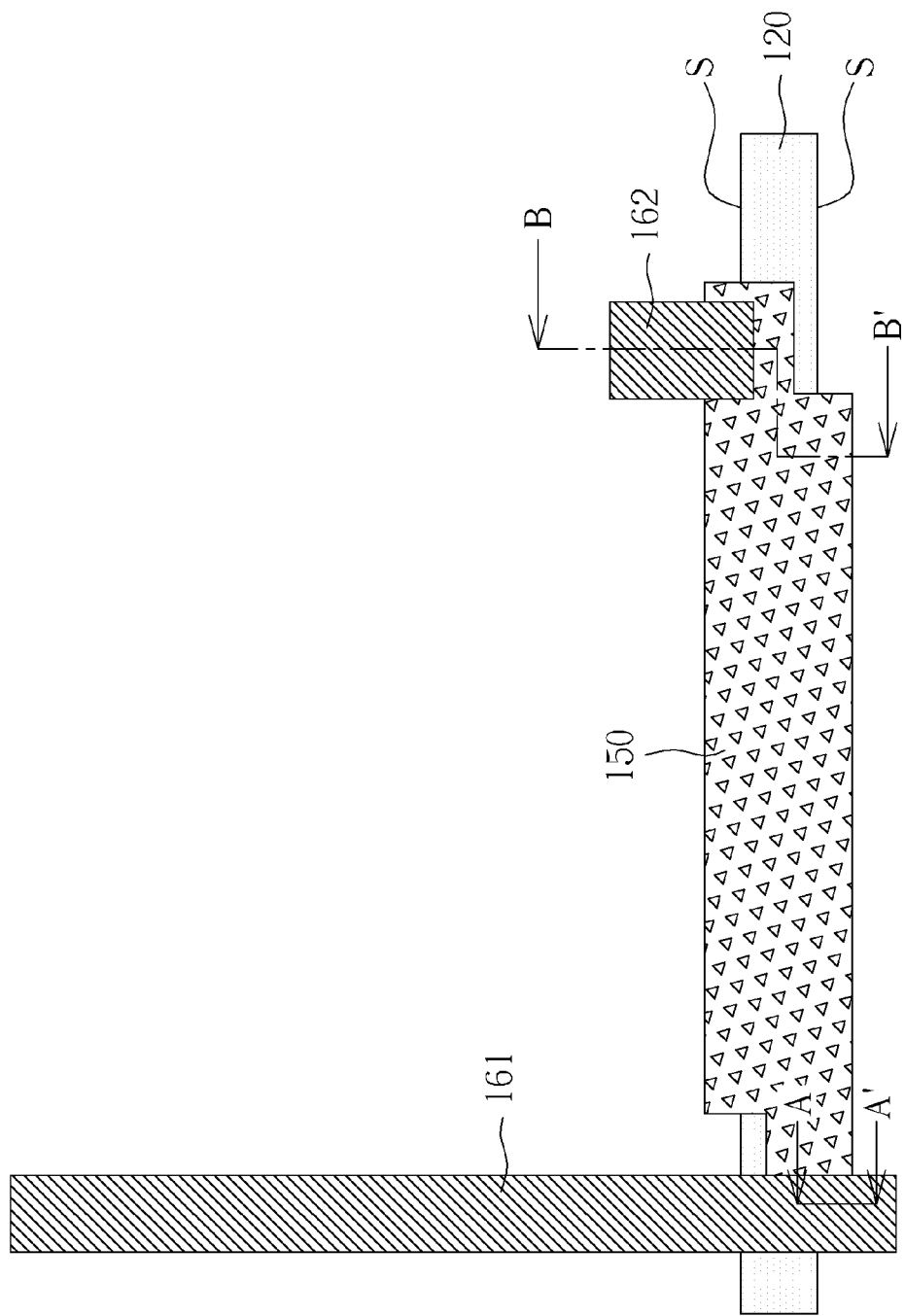
FIGS. 1-4 are schematic diagrams showing a manufacturing method of a pixel structure according to the first preferred embodiment of the invention.
Figure 2:
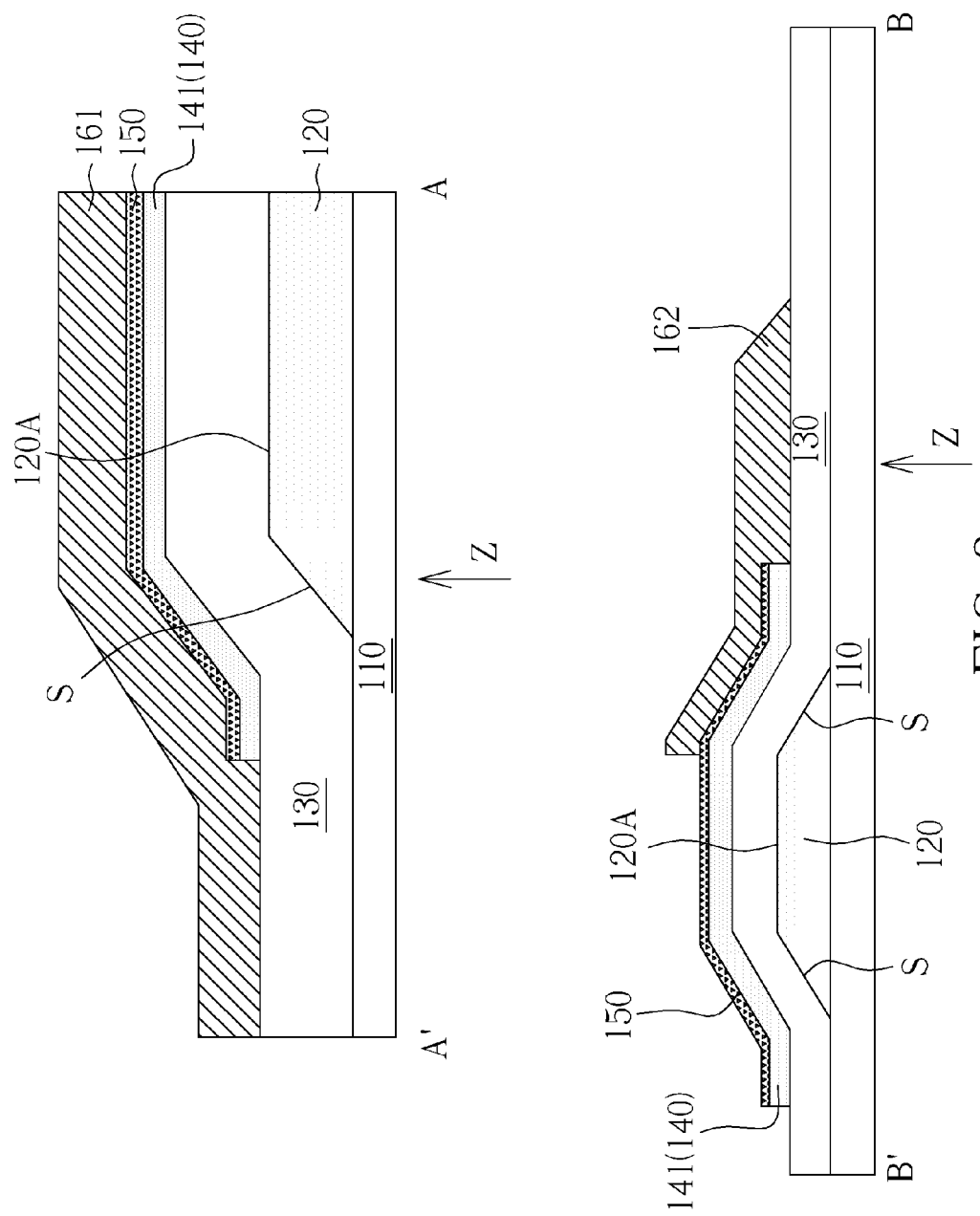
Figure 3:
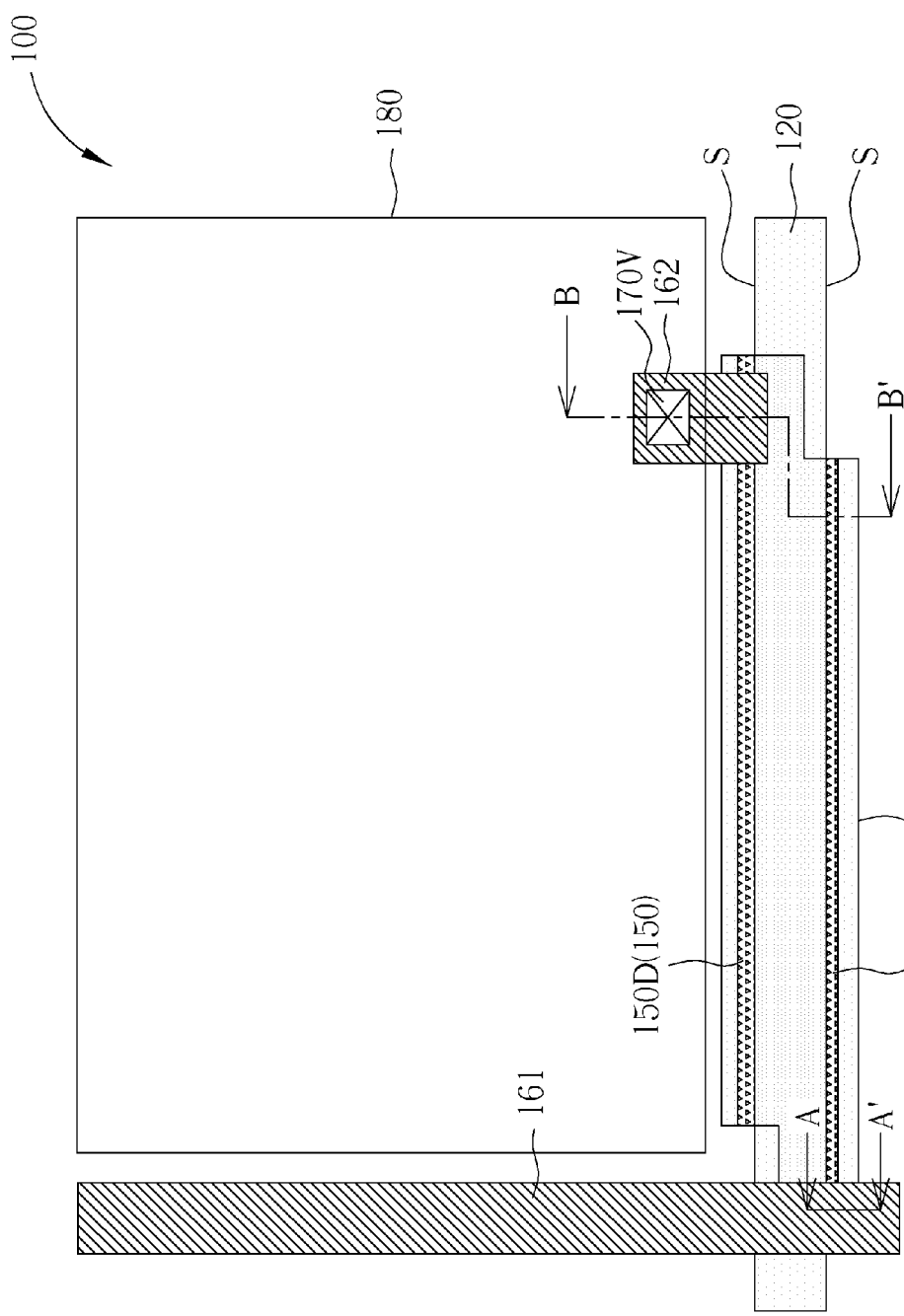
Figure 4:
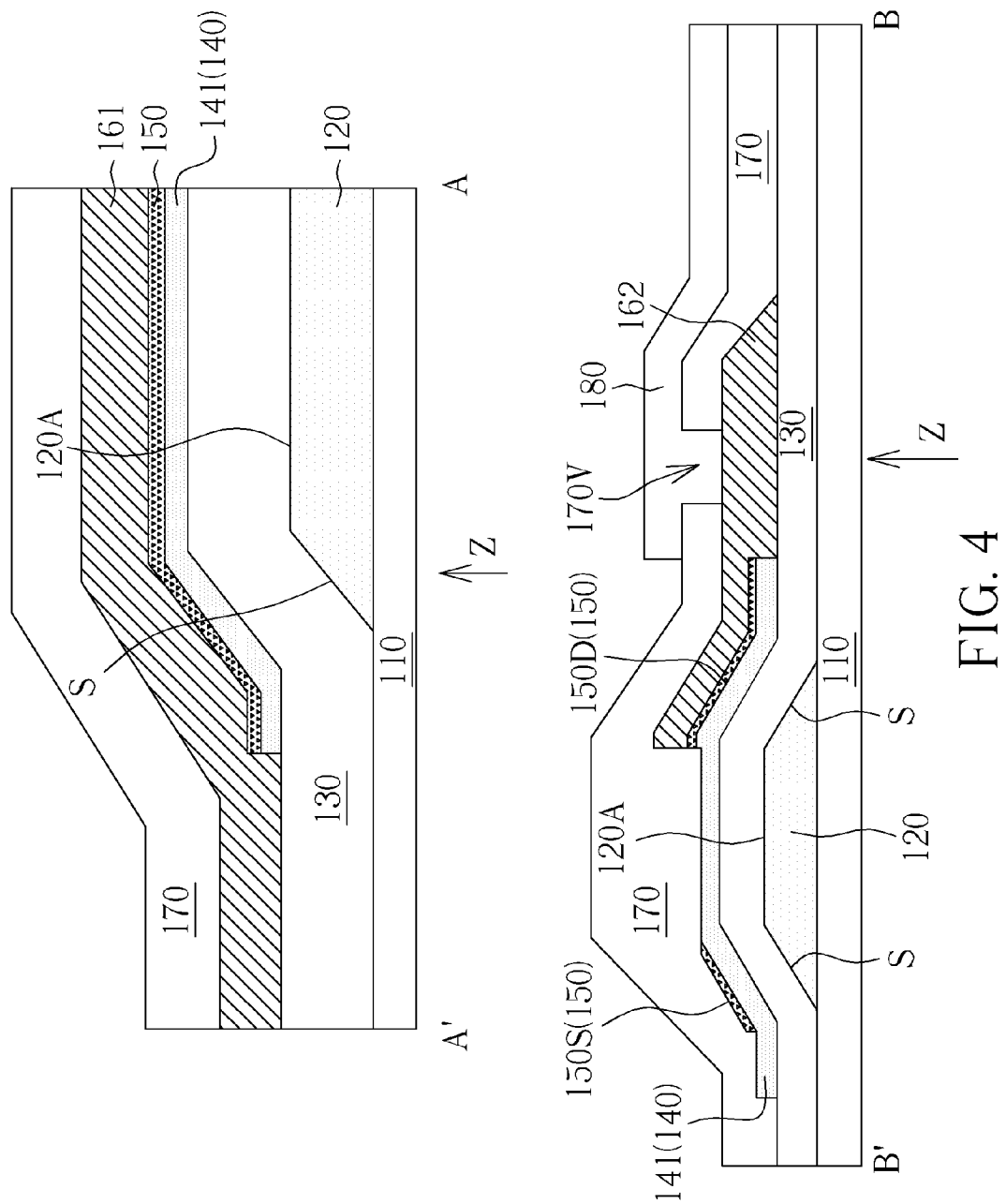

Please refer to FIGS. 1-4. FIGS. 1-4 are schematic diagrams showing a manufacturing method of a pixel structure according to the first preferred embodiment of the invention. FIG. 1 and FIG. 3 are top-view diagrams, FIG. 2 is a cross-sectional view diagram taken along cross-sectional line A-A' and cross-sectional line B-B' in FIG. 1; and FIG. 4 is a cross-sectional view diagram taken along cross-sectional line A-A' and cross-sectional line B-B' in FIG. 3. Please note that the figures are only for illustration and the figures may not be to scale. The scale may be further modified according to different design considerations. In the first preferred embodiment of the present invention, the manufacturing method of the pixel structure includes the following steps. As shown in FIG. 1 and FIG. 2, a substrate 110 is provided. A gate line 120 is formed on the substrate 110, and the gate line 120 has two corresponding edges S and an upper surface 120A. In addition, in the present embodiment, the two corresponding edges S of the gate line 120 are slopes; but the present invention is not limited to this. The status of the edges S may be modified by adjusting the process forming the gate line 120. For example, in other preferred embodiments of the invention, the edges S may be, but not limited to, perpendicular to the substrate 110 if needed. Subsequently, a gate dielectric layer 130 is formed on the gate line 120. Then, a semiconductor layer 140 and an ohmic contact layer 150 are formed sequentially on the gate dielectric layer 130. A patterning process is then performed on the semiconductor layer 140 and the ohmic contact layer 150 to form a semiconductor pattern 141. In addition, in the present embodiment, the semiconductor layer 140 may be an amorphous silicon semiconductor layer, a poly silicon semiconductor layer, an oxide semiconductor layer, or any other semiconductor layer with suitable materials. The ohmic contact layer 150 may be a non-metallic conductive layer such as a doped semiconductor layer. For example, in this embodiment, the semiconductor layer 140 may preferably be an amorphous silicon semiconductor layer and the ohmic contact layer 150 may be a heavily doped amorphous silicon layer such as an n-type doped amorphous silicon layer, but not limited thereto. Furthermore, the semiconductor pattern 141 overlaps the two corresponding edges S of the gate line 120 along a vertical projective direction Z. The vertical projective direction Z is preferably perpendicular to the substrate 110, but not limited thereto.

Subsequently, a data line 161 is formed on the ohmic contact layer 150 and the gate dielectric layer 130, and the data line 161 partially overlaps the gate line 120 along the vertical projective direction Z. The data line 161 may preferably include metal materials, which may be selected from a group of metals consisting of Al, Cu, Ag, Cr, Ti, and Mo, a stack layer of the above-mentioned group of metals, and an alloy of the above-mentioned group of metals, or other conductive materials. Furthermore, in the present embodiment, the manufacturing method of the pixel structure includes forming a conductive pattern 162 on the ohmic contact layer 150. The conductive pattern 162 may preferably overlap partially the ohmic contact layer 150 above one of the edges S of the gate line 120. What's worth explaining is that, in the present embodiment, the data line 161 and the conductive pattern 162 are preferably made of an identical conductive material and formed by an identical process, but the present invention is not limit to this, the data line 161 and the conductive pattern 162 may also be made of different conductive materials or formed by different processes.

As shown in FIG. 3 and FIG. 4, an etching process is performed on the ohmic contact layer 150 to respectively form a non-metal source electrode pattern 150S and a non-metal drain electrode pattern 150D on the two corresponding edges S of the gate line 120. In other words, in the present embodiment, the etching process on the ohmic contact layer 150 is performed to form the non-metal source electrode pattern 150S and the non-metal drain electrode pattern 150D after forming the data line 161. It is worth explaining that the etching process mentioned above is preferably an anisotropic etching process, such as a dry etching process. Without extra photomasks and corresponding lithography processes, the anisotropic etching process on the ohmic contact layer 150 is simply performed to respectively form a non-metal source electrode pattern 150S and a non-metal drain electrode pattern 150D on the two corresponding edges S of the gate line 120. More specifically, because of the thickness of the gate line 120, the edge S preserves difference in height, and then, when the ohmic contact layer 150 is formed, the vertical thickness of the ohmic contact layer 150 above the edge S of the gate line 120 may be thicker than the thickness of the ohmic contact layer 150 on other area. Therefore, when performing the anisotropic etching process on the ohmic contact layer 150, residues of the ohmic contact layer 150 are easily formed above the edges S of the gate line 120. Through this phenomenon, the anisotropic etching process on the ohmic contact layer 150 may be simply performed to respectively form the non-metal source electrode pattern 150S and the non-metal drain electrode pattern 150D on the two corresponding edges S of the gate line 120. In other words, in the present embodiment, the manufacturing method of the pixel structure is able to form the non-metal source electrode pattern 150S and the non-metal drain electrode pattern 150D with the ohmic contact layer 150 without extra manufacturing processes.

Furthermore, in the present embodiment, the manufacturing method of the pixel structure includes forming a protective layer 170 covering the gate dielectric layer 130, the semiconductor pattern 141, a non-metal source electrode pattern 150S, a non-metal drain electrode pattern 150D, the conductive pattern 162, and the data line 161. The protective layer 170 has a contact opening 170V, and the contact opening 170V partially exposes the conductive pattern 162. Furthermore, in the present embodiment, the manufacturing method of the pixel structure includes forming a pixel electrode 180 on the substrate 110, and the pixel electrode 180 is electrically connected to the conductive pattern 162 and the non-metal drain electrode pattern 150D via the contact opening 170V. In other words, in the present embodiment, the non-metal drain electrode pattern 150D is electrically connected to the pixel electrode 180 via the conductive pattern 162. According to the above steps, the pixel structure 100 as shown in FIG. 3 is complete. It is worth noting that, in the present embodiment, the conductive pattern 162 may be employed to improve the electrical connection between the non-metal drain electrode pattern 150D and the pixel electrode 180. Furthermore, by adjusting the size of overlapping regions between the conductive pattern 162 and the non-metal drain electrode pattern 150D, the electric performance of the pixel structure 100 may be improved. In the pixel structure 100 of this embodiment, the etching process on the ohmic contact layer 150 is performed to respectively form the non-metal source electrode pattern 150S and the non-metal drain electrode pattern 150D on the two corresponding edges S of the gate line 120. The influence of a source electrode and a drain electrode upon the aperture ratio in the prior art may be accordingly reduced, the channel width may be accordingly decreased by downsizing the critical dimension of the gate line 120, the aperture ratio may be accordingly increased, the influence of stray capacitance may be accordingly reduced, and related issues may be accordingly improved.

Please refer to FIG. 3 and FIG. 4. As shown in FIG. 3 and FIG. 4, in the first preferred embodiment of the invention, a pixel structure 100 is provided. The pixel structure 100 includes a substrate 110, a gate line 120, a gate dielectric layer 130, a semiconductor pattern 141, a non-metal source electrode pattern 150S, a non-metal drain electrode pattern 150D, a data line 161, a conductive pattern 162, a protective layer 170, and a pixel electrode 180. The gate line 120 and the data line 161 are disposed on the substrate 110. The semiconductor pattern 141 is disposed on the gate line 120, and the semiconductor pattern 141 overlaps two corresponding edges S of the gate line 120 along a vertical projective direction Z. The non-metal source electrode pattern 150S and the non-metal drain electrode pattern 150D are disposed on the semiconductor pattern 141. The non-metal source electrode pattern 150S and the non-metal drain electrode pattern 150D are respectively disposed on the two corresponding edges S of the gate line 120. Furthermore, the non-metal source electrode pattern 150S is partially disposed between the data line 161 and the gate line 120 to be electrically connected to the data line 161. The conductive pattern 162 is disposed on the non-metal drain electrode pattern 150D. The pixel electrode 180 is disposed on the substrate 110, and the pixel electrode 180 is electrically connected to the conductive pattern 162 and the non-metal drain electrode pattern 150D via a contact opening 170V of the protective layer 170. In other words, the non-metal drain electrode pattern 150D is electrically connected to the pixel electrode 180 via the conductive pattern 162. In the present embodiment, the non-metal source electrode pattern 150S and the non-metal drain electrode pattern 150D may be made of a non-metallic conductive layer such as a doped semiconductor layer. The non-metal source electrode pattern 150S and the non-metal drain electrode pattern 150D preferably consist of a doped semiconductor layer, but not limited thereto. In other words, in the present embodiment, only the non-metal source electrode pattern 150S and the non-metal drain electrode pattern 150D respectively serve as the source electrode and the drain electrode of the pixel structure 100. The influence of a source electrode and a drain electrode made of non-transparent metallic materials on the aperture ratio in the prior art may be accordingly reduced. In the present embodiment, the material characteristic of components of the pixel structure 100 has been mentioned in the manufacturing method above, and the description will therefore not be repeated. It is worth noting that, because the non-metal source electrode pattern 150S and the non-metal drain electrode pattern 150D are respectively disposed on the two corresponding edges S of the gate line 120, the influence of a source electrode and a drain electrode made of non-transparent metallic materials on the aperture ratio in the prior art may be accordingly reduced, the channel width may be accordingly decreased by downsizing the critical dimension of the gate line 120, the aperture ratio may be accordingly increased, the influence of the stray capacitance may be accordingly reduced, and related issues may be accordingly improved. Furthermore, since the non-metal source electrode pattern 150S and the non-metal drain electrode pattern 150D are respectively disposed on the two corresponding edges S of the gate line 120, the electric performances of the pixel structure 100 may be improved by increasing lengths of the non-metal source electrode pattern 150S, the non-metal drain electrode pattern 150D, and the semiconductor pattern 141 without affecting the aperture ratio.

The following description is based on different embodiments of the invention, a pixel structure and a manufacturing method thereof. To simplify the description, the following description will focus on the differences among embodiments rather than similar parts. Furthermore, the same reference numbers are used in each description of embodiments for the convenience of cross-reference.

Figure 5:
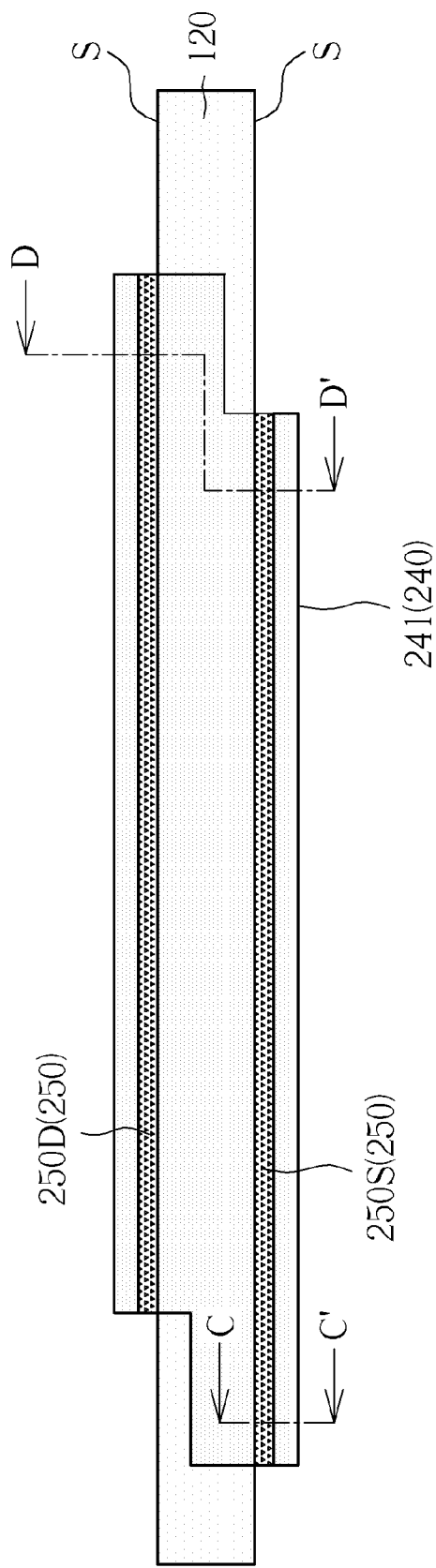
FIGS. 5-8 are schematic diagrams showing a manufacturing method of a pixel structure according to the second preferred embodiment of the invention.
Figure 6:
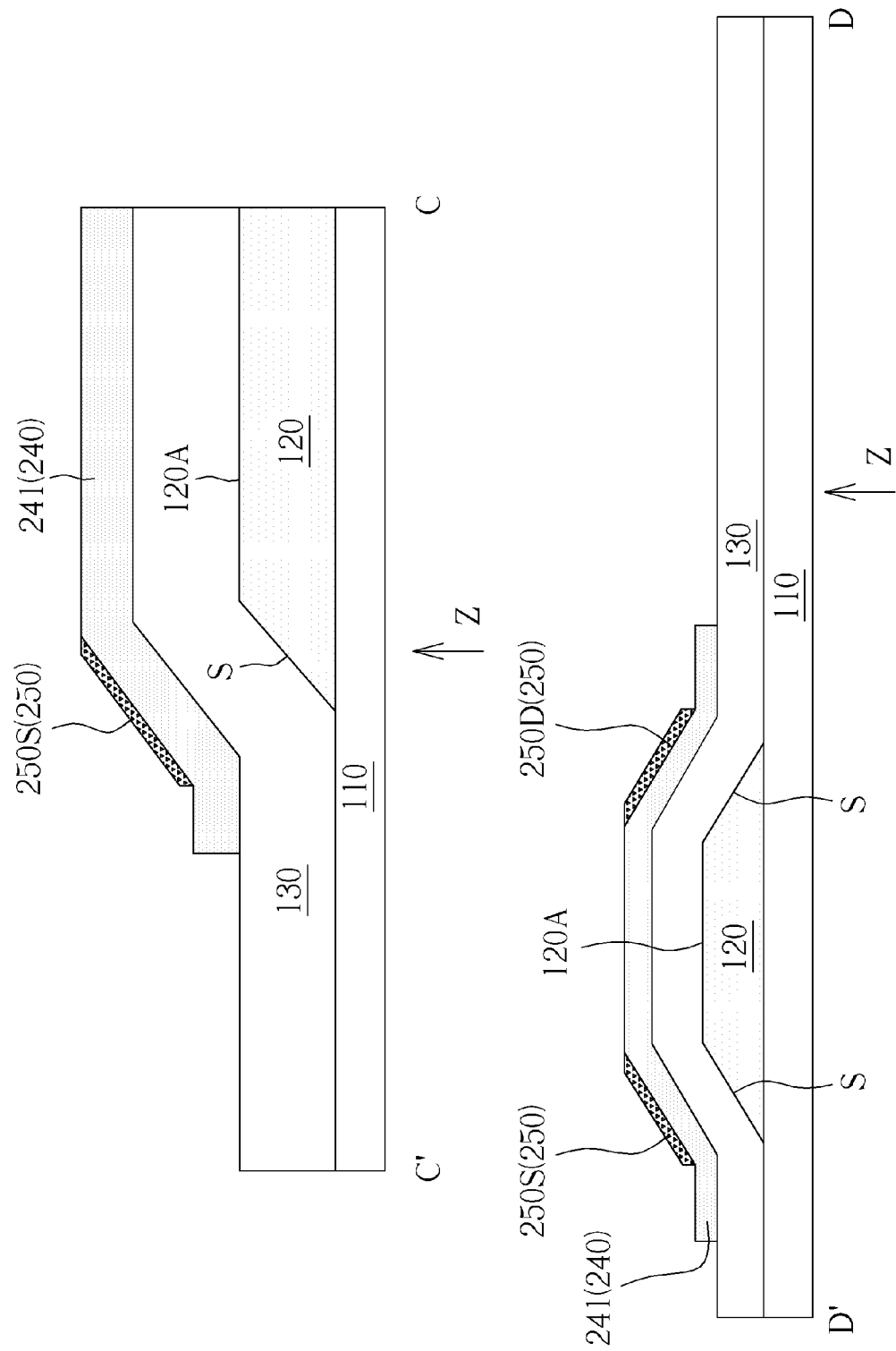
Figure 7:
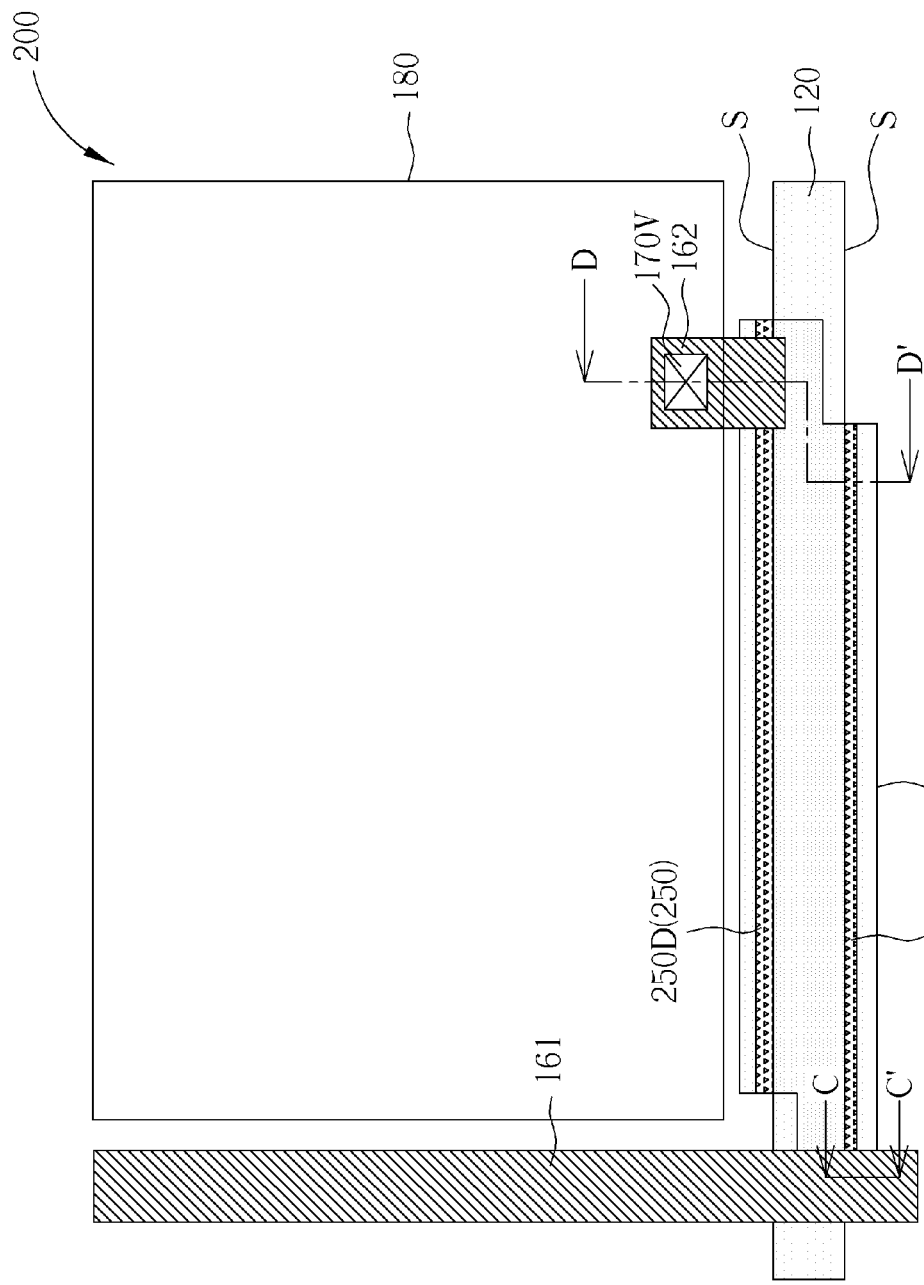
Figure 8:
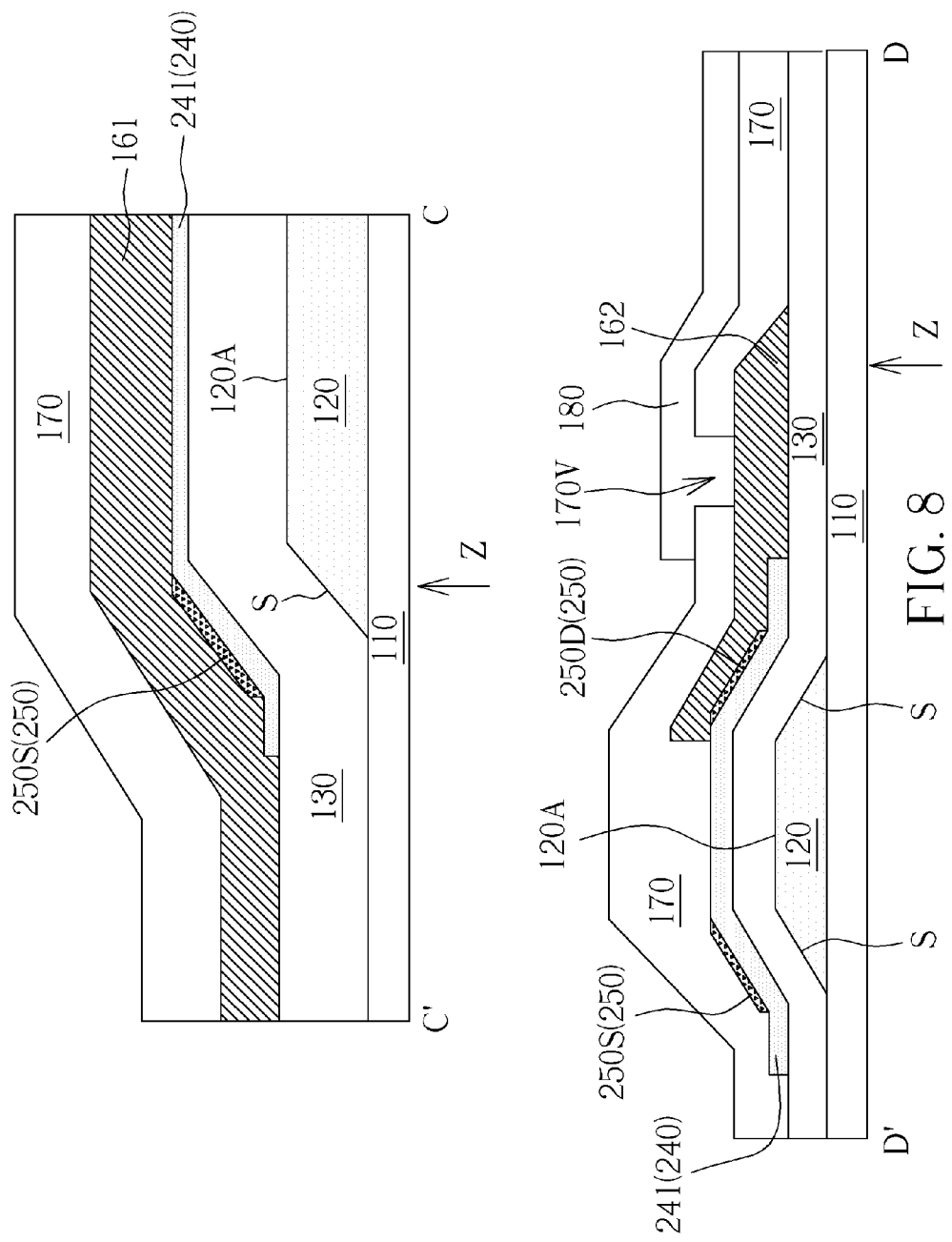

Please refer to FIGS. 5-8. FIGS. 5-8 are schematic diagrams showing a manufacturing method of a pixel structure according to the second preferred embodiment of the invention. FIG. 5 and FIG. 7 are top-view diagrams, FIG. 6 is a cross-sectional view diagram taken along cross-sectional line C-C' and cross-sectional line D-D' in FIG. 5; and FIG. 8 is a cross-sectional view diagram taken along cross-sectional line C-C' and cross-sectional line D-D' in FIG. 7. The difference between the manufacturing method of the pixel structure in the second preferred embodiment of the invention and the manufacturing method of the pixel structure in the first preferred embodiment is in the following description. As shown in FIG. 5 and FIG. 6, in the manufacturing method of the pixel structure of the present embodiment, a semiconductor layer 240 and an ohmic contact layer 250 are sequentially formed on the gate dielectric layer 130. After a patterning process on the semiconductor layer 240 and the ohmic contact layer 250, the semiconductor layer 240 is patterned to form a semiconductor pattern 241. In addition, the semiconductor pattern 241 overlaps the two corresponding edges S of the gate line 120 along the vertical projective direction Z. Then, after the semiconductor pattern 241 is formed, an etching process is performed on the ohmic contact layer to respectively form a non-metal source electrode pattern 250S and a non-metal drain electrode pattern 250D on the two corresponding edges S of the gate line 120. It is worth noting that the etching process on the ohmic contact layer 250 is preferably an anisotropic etching process, such as a dry etching process. Without extra photomasks and corresponding lithography processes, the anisotropic etching process on the ohmic contact layer 250 is simply performed to respectively form the non-metal source electrode pattern 250S and the non-metal drain electrode pattern 250D on two corresponding edges S of the gate line 120. In addition, the etching process mentioned above may be employed for forming the non-metal source electrode pattern 250S and the non-metal drain electrode pattern 250D without overlapping the upper surface 120A of the gate line 120 along the vertical projective direction Z, but not limited thereto. In other words, after the etching process on the ohmic contact layer 250, the ohmic contact layer 250 only remains on the two corresponding edges S of the gate line 120 to respectively form the non-metal source electrode pattern 250S and the non-metal drain electrode pattern 250D. Other non-necessary ohmic contact layer 250 residues, which may affect the subsequent electric performances, may be avoided by modifying the etching process.

Furthermore, as shown in FIG. 7 and FIG. 8, in the manufacturing method of the pixel structure of the present embodiment, the data line 161 is formed after forming the non-metal source electrode pattern 250S and the non-metal drain electrode pattern 250D, and the data line 161 partially covers the gate dielectric layer 130, the semiconductor pattern 241 and the non-metal source electrode pattern 250S. In other words, in the present embodiment, the etching process on the ohmic contact layer 250 is performed before forming the data line 161 so that the non-metal source electrode pattern 250S and the non-metal drain electrode pattern 250D are formed before forming the data line 161. Furthermore, in the present embodiment, the manufacturing method of the pixel structure includes forming a conductive pattern 162 on the non-metal drain electrode pattern 250D. In the present embodiment, the data line 161 and the conductive pattern 162 are preferably made of an identical conductive material and formed through an identical process, but the present invention is not limited to this, the data line 161 and the conductive pattern 162 may also be made of different conductive materials or formed through different processes. Apart from the sequence of the etching process on the ohmic contact layer 250, the non-metal source electrode pattern 250S, and the non-metal drain electrode pattern 250D, the process steps and the material characteristic of the components in this embodiment are similar to those in the above-mentioned first preferred embodiment detailed above and will therefore not be redundantly described.

Please refer to FIG. 7 and FIG. 8. As shown in FIG. 7 and FIG. 8, in the second preferred embodiment of the invention, a pixel structure 200 is provided. The difference between the pixel structure 200 and the pixel structure 100 in the above-mentioned first preferred embodiment is that the non-metal source electrode pattern 250S and the non-metal drain electrode pattern 250D preferably do not overlap the upper surface 120A of the gate line 120 along the vertical projective direction Z, but not limited thereto. In other words, in the present embodiment, the non-metal source electrode pattern 250S and the non-metal drain electrode pattern 250D are respectively merely disposed on the two corresponding edges S of the gate line 120 in order to reduce the malignant influence on the electric performances of the pixel structure 200. Apart from the non-metal source electrode pattern 250S and the non-metal drain electrode pattern 250D in the present embodiment, the material characteristics and the allocation of the components are similar to those in the above-mentioned first preferred embodiment detailed above and will not be redundantly described.

Figure 9:
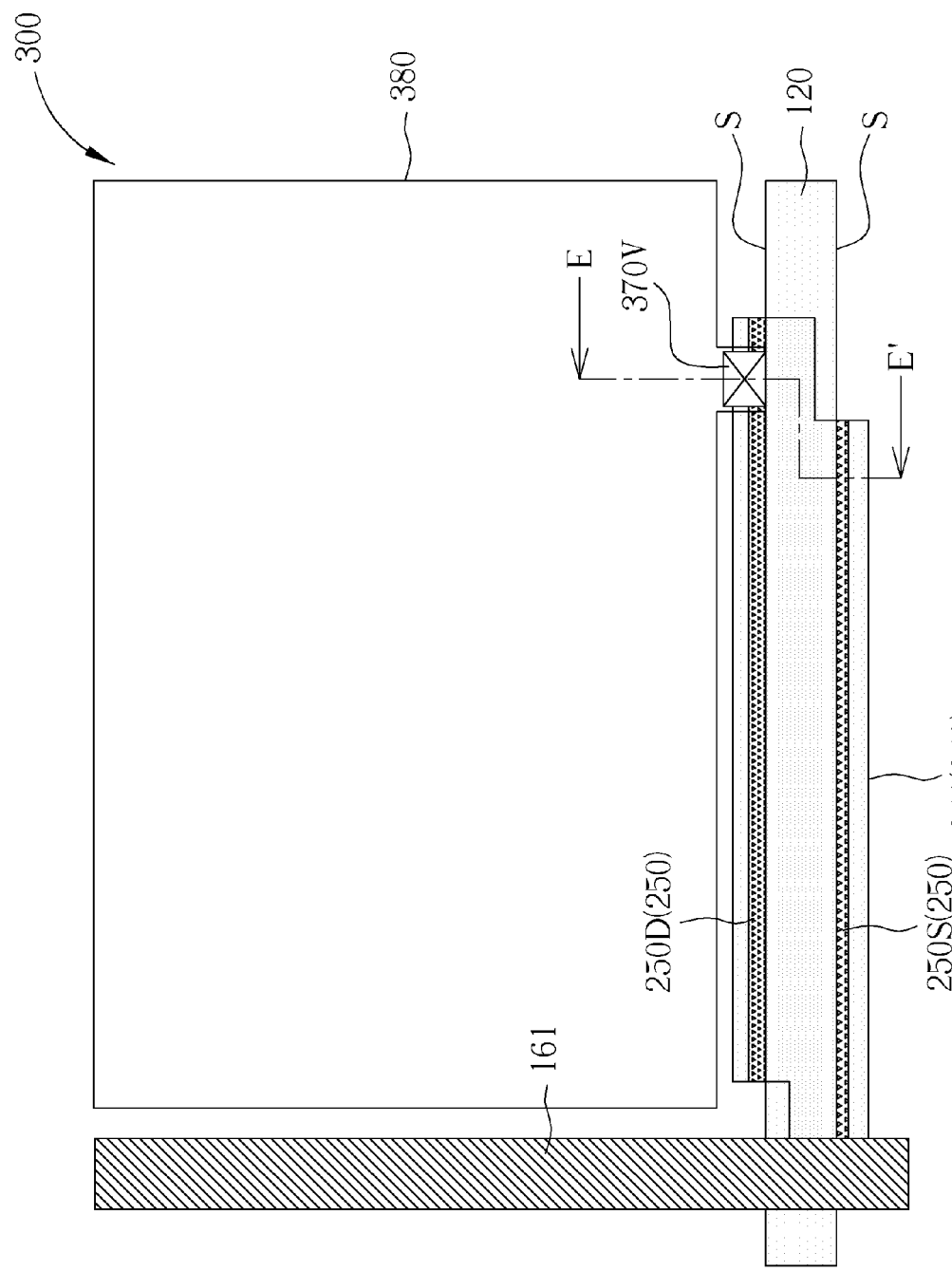
FIG. 9 and FIG. 10 are schematic diagrams showing a pixel structure according to the third preferred embodiment of the invention.
Figure 10:
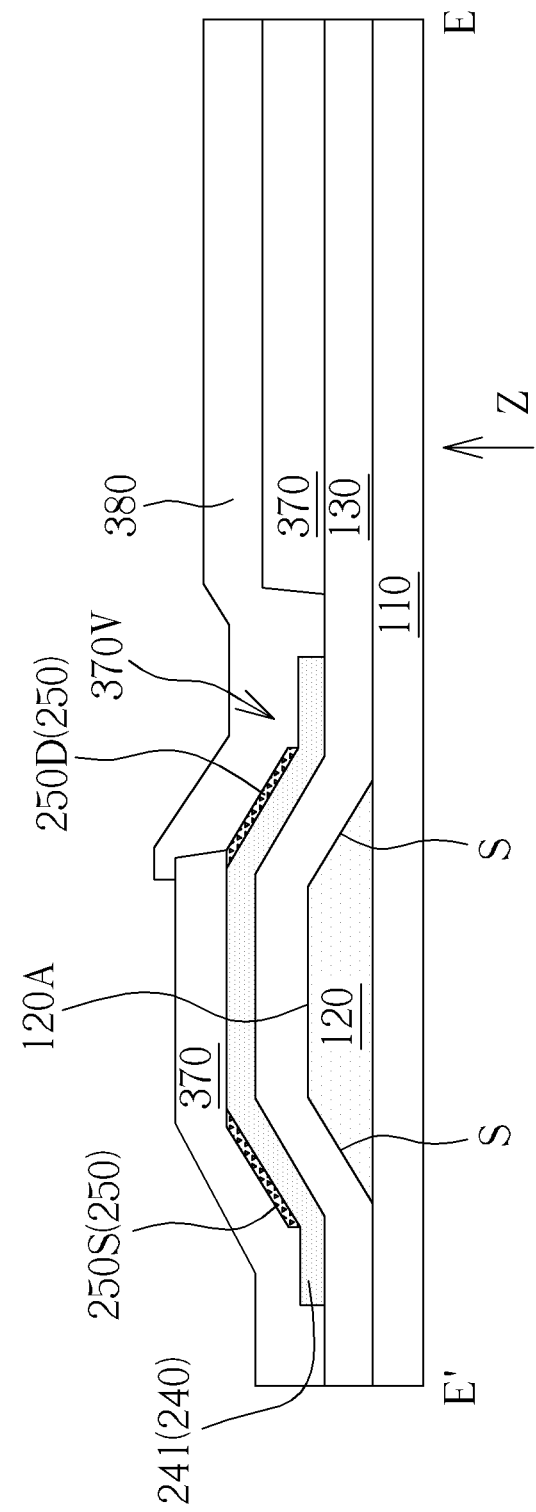

Please refer to FIG. 9 and FIG. 10. FIG. 9 and FIG. 10 are schematic diagrams showing a pixel structure according to the third preferred embodiment of the invention. FIG. 9 is a top-view diagram, and FIG. 10 is a cross-sectional view diagram taken along cross-sectional line E-E' in FIG. 9. As shown in FIG. 9 and FIG. 10, in the third preferred embodiment of the invention, a pixel structure 300 is provided. The pixel structure 300 includes a substrate 110, a gate line 120, a gate dielectric layer 130, a semiconductor pattern 241, a non-metal source electrode pattern 250S, a non-metal drain electrode pattern 250D, a data line 161, a protective layer 370, and a pixel electrode 380. The difference between the pixel structure 300 in the present embodiment and the pixel structure 200 in the above-mentioned second preferred embodiment is in the following description. The pixel structure 300 doesn't include a conductive pattern. The protective layer 370 has a contact opening 370V which exposes the non-metal drain electrode pattern 250D. The pixel structure 380 is electrically connected to the non-metal drain electrode pattern 250D via the contact opening 370V. In other words, the pixel electrode 380 is directly connected to the non-metal drain electrode pattern 250D to electrically connect the pixel electrode 380 to the non-metal drain electrode pattern 250D. Apart from the location of the contact opening 370V, the structure of the pixel electrode 380, and the absence of a conductive pattern, the process steps, the material characteristics and the allocation of the components are similar to those in the above-mentioned second preferred embodiment detailed above, and will not be redundantly described. It is worth noting that, since the pixel structure 300 doesn't include a conductive pattern, the aperture ratio of the pixel structure 300 can be further increased.

In summary, the pixel structure of the present invention uses the properties of the following phenomenon: after performing the etching process on the ohmic contact layer, residues tend to remain on the edges of the gate line; i.e. without extra photomasks and corresponding lithography processes, the anisotropic etching process on the ohmic contact layer may be simply performed to respectively form a non-metal source electrode pattern and a non-metal drain electrode pattern on the two corresponding edges of the gate line. According to the non-metal source electrode pattern and the non-metal drain electrode pattern in this invention, the influence of the source electrode and the drain electrode on the aperture ratio in the prior art may be reduced, the aperture ratio may be increased, and the electric performances may be improved by downsizing the critical dimension of the gate line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, comprising:
   a substrate;
   a gate line, disposed on the substrate;
   a data line, disposed on the substrate;
   a semiconductor pattern, disposed on the gate line, the semiconductor pattern overlapping two corresponding edges of the gate line along a vertical projective direction;
   a non-metal source electrode pattern and a non-metal drain electrode pattern, disposed on the semiconductor pattern, wherein the non-metal source electrode pattern and the non-metal drain electrode pattern are respectively disposed on the two corresponding edges of the gate line, and the non-metal source electrode pattern is partially disposed between the data line and the gate line along the vertical projective direction to be electrically connected to the data line, wherein the non-metal source electrode pattern and the non-metal drain electrode pattern are a doped semiconductor layer, wherein the non-metal source electrode pattern does not overlap an upper surface of the gate line along the vertical projective direction, and the non-metal drain electrode pattern does not overlap the upper surface of the gate line along the vertical projective direction; and
   a pixel electrode, disposed on the substrate, the pixel electrode being electrically connected to the non-metal drain electrode pattern.

2. The pixel structure of claim 1, further comprising a conductive pattern, disposed on the non-metal drain electrode pattern, wherein the non-metal drain electrode pattern is electrically connected to the pixel electrode via the conductive pattern.

3. The pixel structure of claim 1, wherein the pixel electrode is directly connected to the non-metal drain electrode pattern to electrically connect the pixel electrode with the non-metal drain electrode pattern.

4. A manufacturing method of a pixel structure, comprising:
   providing a substrate;
   forming a gate line on the substrate;
   forming a gate dielectric layer on the gate line;
   forming a semiconductor layer and an ohmic contact layer sequentially on the gate dielectric layer;
   performing a patterning process on the semiconductor layer to form a semiconductor pattern, wherein the semiconductor pattern overlaps two corresponding edges of the gate line along a vertical projective direction;
   forming a data line on the ohmic contact layer and the gate dielectric layer, wherein the data line partially overlaps the gate line along the vertical projective direction;
   performing an etching process on the ohmic contact layer to respectively form a non-metal source electrode pattern and a non-metal drain electrode pattern on the two corresponding edges of the gate line, wherein the non-metal source electrode pattern and the non-metal drain electrode pattern are a doped semiconductor layer, and the non-metal source electrode pattern is partially disposed between the data line and the gate line along the vertical projective direction to be electrically connected to the data line, wherein the etching process on the ohmic contact layer is performed to form the non-metal source electrode pattern and the non-metal drain electrode pattern without overlapping an upper surface of the gate line along the vertical projective direction; and
   forming a pixel electrode on the substrate, wherein the pixel electrode is electrically connected to the non-metal drain electrode pattern.

5. The manufacturing method of the pixel structure of claim 4, wherein the ohmic contact layer is a non-metallic conductive layer.

6. The manufacturing method of the pixel structure of claim 4, wherein the etching process on the ohmic contact layer is performed to form the non-metal source electrode pattern and the non-metal drain electrode pattern before forming the data line.

7. The manufacturing method of the pixel structure of claim 4, further comprising: forming a conductive pattern on the non-metal drain electrode pattern, wherein the non-metal drain electrode pattern is electrically connected to the pixel electrode via the conductive pattern.

8. The manufacturing method of the pixel structure of claim 4, wherein the pixel electrode is directly connected to the non-metal drain electrode pattern to electrically connect the pixel electrode with the non-metal drain electrode pattern.

* * * * *